US012666657B2

(12) United States Patent (10) Patent No.: US 12,666,657 B2
Sun (45) Date of Patent: Jun. 23, 2026

(54) SUPER FLASH AND METHOD FOR MANUFACTURING SAME

(71) Applicant: Shanghai Huali Integrated Circuit Corporation, Shanghai (CN)

(72) Inventor: Qin Sun, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 685 days.

(21) Appl. No.: 18/182,684

(22) Filed: Mar. 13, 2023

(65) Prior Publication Data

US 2024/0038861 A1 Feb. 1, 2024

(30) Foreign Application Priority Data

Jul. 27, 2022 (CN) .......................... 202210889893.4

(51) Int. Cl.
*H10D 30/68* (2025.01)
*H10D 30/01* (2025.01)
(52) U.S. Cl.
CPC ..... *H10D 30/6894* (2025.01); *H10D 30/0411* (2025.01); *H10D 30/68* (2025.01); *H10D 30/6892* (2025.01)
(58) Field of Classification Search
CPC ........... H10D 30/6894; H10D 30/0411; H10D 30/68; H10D 30/6892; H10D 84/0144; H10D 64/01354; H10D 84/038; H10D 84/0165–0195; H10D 84/85–859; H10D 84/907–994; H10D 84/0193; H10D 84/853; H10D 64/691; H10D 30/43; H10D 30/6735; H10D 30/6757; H10D 62/121; H10D 84/83; H10D 30/014; H10D 64/685; H10D 84/0177; H10D 84/0181; H10D 89/601; H10D 84/834; H10D 30/62; H10D 30/6739; H10D 30/673; H10D 30/689; H10D 30/0323; H10D 30/6713; H10D 30/6744; H10D 62/021; H10D 64/015; H10D 64/021; H10D 30/60; H10D 62/151; H10D 62/364; H10D 64/017; H10D 30/797; H10D 64/67; H10D 64/689; H10D 30/0415; H10D 30/701; B81C 2203/0728; B81C 2203/0735; B81C 2203/0742; H01L 21/31116; H01L 21/30604; H01L 21/3065; H01L 21/28291; G11C 16/0466–0475; G11C 27/005; G11C 11/5671;

(Continued)

(56) References Cited

U.S. PATENT DOCUMENTS

2016/0307896 A1* 10/2016 Lin ........................ H10D 84/85

* cited by examiner

*Primary Examiner* — Moin M Rahman
(74) *Attorney, Agent, or Firm* — Quarles & Brady LLP

(57) ABSTRACT

The application discloses a super flash including: a first gate trench formed at the top of a source region, wherein a floating gate and a control gate are formed in the first gate trench. A second nitrogen oxide layer and a first oxide layer are formed between a first side surface of the floating gate and side and bottom surfaces of the first gate trench. A third nitrogen oxide layer and a fourth oxide layer are formed between a second side surface of the floating gate and a side surface of the control gate. The floating gate is a TiN layer; and the top of the floating gate is higher than a top surface of the control gate. The second nitrogen oxide layer and the third nitrogen oxide layer prevent the diffusion of oxygen into the floating gate. The present application also discloses a method for manufacturing a super flash.

8 Claims, 6 Drawing Sheets

(58) Field of Classification Search
CPC ...... G11C 14/0018; G11C 11/22–2297; G11C
11/5657; G11C 14/0027; G11C 14/0072;
G11C 16/02; H10B 51/00–50; H10B
53/00–50; H10B 69/00
See application file for complete search history.

204a

203

301a

204a

203

205a

301a

204a

203

303

205a

301a

204a

203

206a

302a

205a

301a

204a

203

206

302

205

301

204

203

401

402

402

SUPER FLASH AND METHOD FOR MANUFACTURING SAME

CROSS-REFERENCES TO RELATED APPLICATIONS

This application claims the priority to Chinese patent application No. CN 202210889893.4, filed on Jul. 27, 2022, and entitled "SUPER FLASH AND METHOD FOR MANUFACTURING SAME", the disclosure of which is incorporated herein by reference in entirety.

TECHNICAL FIELD

The present application relates to a method for manufacturing a semiconductor integrated circuit, in particular to a super flash (SF). The present application also relates to a method for manufacturing a super flash.

BACKGROUND

Taking SST-ESF3 as the prototype, a novel SF structure (38SF) based on the 38 nm node is proposed, in which the erasing efficiency is improved by changing a floating gate (FG) structure, and the following purposes can be achieved by using a selection gate of a low voltage such as 1.2V:
1) reducing the area of a cell;
2) reducing the programming/erasing voltage and saving mask layers; and
3) reading a low voltage and reducing power consumption.

The novel structure of 38SF in the industry uses the TiN material as FG, W as a control gate (CG), and oxide layers formed by high temperature oxidation (HTO), i.e., HTO layers, respectively as a lower tunneling oxide (TUNOX) layer and an upper barrier layer, i.e., a control dielectric layer. In this way, an FG charge storage layer of an O—TIN—O layer is formed. However, a reaction of oxygen with titanium nitride occurs at a high temperature, resulting in the discontinuity of the titanium nitride, which seriously affects the electrical erasure performance of the device.

The following description is provided with reference to the drawings:

FIG. 1 is a schematic diagram of a structure of an existing super flash. FIGS. 2A-2F are schematic diagrams of device structures in sub-steps of forming a floating gate 105 in an existing method for manufacturing a super flash. The existing super flash includes:

a first gate trench 103 formed at the top of a source region 102, wherein a bottom surface of the first gate trench 103 is lower than a top surface of a semiconductor substrate 101, and a top surface of the first gate trench 103 is higher than the top surface of the semiconductor substrate 101.

Generally, the semiconductor substrate 101 includes a silicon substrate.

The source region 102 is formed in a surface region of the semiconductor substrate 101 at the bottom of the first gate trench 103.

Generally, in the corresponding paper direction perpendicular to the section in FIG. 1, the source regions 102 of cells of different super flashes are connected together to form a source region line (SL).

The floating gate 105 and a control gate 107 are formed in the first gate trench 103.

Generally, the control gate 107 is a tungsten gate. The control gate 107 is in direct contact with the source region 102 at the bottom thereof.

An oxide layer 104 is formed between a first side surface of the floating gate 105 and side and bottom surfaces of the first gate trench 103. The oxide layer 104 is an HTO oxide layer.

An oxide layer 106 is formed between a second side surface of the floating gate 105 and a side surface of the control gate 107. The oxide layer 106 is an HTO oxide layer.

The floating gate 105 is a TiN layer. The top of the floating gate 105 is higher than a top surface of the control gate 107.

Two word line gates 108 are symmetrically arranged on the semiconductor substrate 101 on both sides of the first gate trench 103, and a first gate dielectric layer (not shown) is provided to isolate the word line gate 108 from the semiconductor substrate 101.

A second dielectric layer 109 is provided to isolate a side surface of the first gate trench 103 from a second side surface of the word line gate 108. A first inter-gate dielectric layer is formed by stacking the second dielectric layer 109 and the oxide layer 104. An erasing gate 113 is formed at the top of the first gate trench 103, and the coverage of the erasing gate 113 is greater than a region for forming the first gate trench 103. A second inter-gate dielectric layer 112 is provided to isolate the erasing gate 113 from the first inter-gate dielectric layer, the floating gate 105, and the oxide layer 106 at the bottom thereof.

Generally, the second dielectric layer 109 and the second inter-gate dielectric layer 112 are both oxide layers, so images corresponding to the second dielectric layer 109, the second inter-gate dielectric layer 112, the oxide layer 104, and the oxide layer 106 in FIG. 1 are all filled with the same points.

A drain region 111 is formed in the surface region of the semiconductor substrate 101 on a first side surface of the word line gate 108 in a self-aligned manner. Generally, a spacer (not shown) is also formed on the first side surface of the word line gate 108, and the drain region 111 is self-aligned with the spacer on the first side surface of the word line gate 108. A lightly doped drain (LDD) region 110 is also formed on one side of the drain region 111, and the lightly doped drain region 110 is self-aligned with the first side surface of the word line gate 108.

Generally, the word line gate 108 is a polysilicon gate or a metal gate. The erasing gate 113 is a polysilicon gate or a metal gate.

FIGS. 2A-2B are schematic diagrams of device structures in sub-steps of forming the floating gate in the existing method for manufacturing a super flash. The existing method for manufacturing a super flash includes the following steps:

Step 1. Referring to FIG. 1, the first gate trench 103 is formed in a region for forming the floating gate 105 and the control gate 107. The first gate trench 103 is located at the top of a region for forming the source region 102. The bottom surface of the first gate trench 103 is lower than the top surface of the semiconductor substrate 101, and the top surface of the first gate trench 103 is higher than the top surface of the semiconductor substrate 101.

Step 2. The source region 102 is formed in the surface region of the semiconductor substrate 101 at the bottom of the first gate trench 103.

Step 3. The floating gate 105 is formed, including the following sub-steps.

Step 31. Referring to FIG. 2A, an oxide layer 104a is formed on the side and bottom surfaces of the first gate trench 103.

In the existing method, the oxide layer 104a is formed by means of an HTO oxidation process.

Step 32. Referring to FIG. 2A, a TiN layer 105*a* of the floating gate 105 is formed on the surface of the oxide layer 104*a*.

Step 33. Referring to FIG. 2A, an oxide layer 106*a* is formed on the surface of the TiN layer 105*a*.

In the existing method, the oxide layer 106*a* is formed by means of an HTO oxidation process.

Step 34. Referring to FIG. 2B, the oxide layer 106*a*, the TiN layer 105*a*, and the oxide layer 104*a* are fully etched so that the oxide layer 106, the TiN layer, and the oxide layer 104 are retained only on the side surface of the first gate trench 103 and form a spacer structure. The oxide layer 106*a*, the TiN layer 105*a*, and the oxide layer 104*a* on the bottom surface of the first gate trench 103 outside the spacer structure and outside the first gate trench 103 are removed. The retained TiN layer forms the floating gate 105. In FIG. 2B, the etched oxide layer 106*a*, the TiN layer 105*a*, and the oxide layer 104*a* are represented by marks 106, 105, and 104 respectively.

It can be seen from FIG. 2A that, the TiN layer 105*a* and the oxide layers 104*a* and 106*a* on both sides thereof present a structure of an O—TiN—O layer, wherein O represents an oxide layer. A reaction of oxygen with titanium nitride occurs at a high temperature, resulting in the discontinuity of the titanium nitride, which seriously affects the electrical erasure performance of the device. FIG. 5A is a picture of forming the TiN layer of the floating gate in the existing method for manufacturing a super flash. Mark 401 corresponds to the picture of the TiN layer 105*a*. It can be seen that a line corresponding to the mark 401 is broken, indicating that the TiN layer 105*a* is discontinuous.

BRIEF SUMMARY

According to some embodiments in this application, a super flash provided by the present application includes:

a first gate trench formed at the top of a source region, wherein a bottom surface of the first gate trench is lower than a top surface of a semiconductor substrate, and a top surface of the first gate trench is higher than the top surface of the semiconductor substrate.

The source region is formed in a surface region of the semiconductor substrate at the bottom of the first gate trench.

A floating gate and a control gate are formed in the first gate trench.

A second nitrogen oxide layer and a first oxide layer are formed between a first side surface of the floating gate and side and bottom surfaces of the first gate trench.

A third nitrogen oxide layer and a fourth oxide layer are formed between a second side surface of the floating gate and a side surface of the control gate.

The floating gate is a TiN layer; and the top of the floating gate is higher than a top surface of the control gate.

The second nitrogen oxide layer forms a barrier layer for the diffusion of oxygen in the first oxide layer to the floating gate, the third nitrogen oxide layer forms a barrier layer for the diffusion of oxygen in the fourth oxide layer to the floating gate, reducing the amount of oxygen entering the floating gate and ensuring that the TiN layer of the floating gate from the bottom to the top of the floating gate is kept in a continuous structure, so that during erasing, stored charges can move from the bottom to the top of the floating gate and be led out; and the oxygen entering the floating gate makes the TiN layer of the floating gate present a nanocrystalline structure, thus increasing the ability of the floating gate to capture the stored charges.

In some cases, two word line gates are symmetrically arranged on the semiconductor substrate on both sides of the first gate trench, and a first gate dielectric layer is provided to isolate the word line gate from the semiconductor substrate.

A second dielectric layer is provided to isolate a side surface of the first gate trench from a second side surface of the word line gate, and a first inter-gate dielectric layer is formed by stacking the second dielectric layer, the first oxide layer, and the second nitrogen oxide layer.

An erasing gate is formed at the top of the first gate trench, and the coverage of the erasing gate is greater than a region for forming the first gate trench; and a second inter-gate dielectric layer is provided to isolate the erasing gate from the first inter-gate dielectric layer, the floating gate, the third nitrogen oxide layer, and the fourth oxide layer at the bottom thereof.

A drain region is formed in the surface region of the semiconductor substrate on a first side surface of the word line gate in a self-aligned manner.

In some cases, the first oxide layer is an HTO oxide layer.

In some cases, the second nitrogen oxide layer is a nitride layer formed by nitriding the surface of the first oxide layer.

In some cases, a process of nitriding the surface of the first oxide layer is a SPA process.

In some cases, the fourth oxide layer is an HTO oxide layer.

In some cases, the third nitrogen oxide layer is formed by means of a SPA process.

In some cases, NO annealing is performed on the surface of the TiN layer before the SPA process of the third nitrogen oxide layer.

In order to solve the above technical problem, the method for manufacturing a super flash provided by the present application includes the following steps:

step 1, forming a first gate trench in a region for forming a floating gate and a control gate, wherein the first gate trench is located at the top of a region for forming a source region, a bottom surface of the first gate trench is lower than a top surface of a semiconductor substrate, and a top surface of the first gate trench is higher than the top surface of the semiconductor substrate;

step 2, forming the source region in a surface region of the semiconductor substrate at the bottom of the first gate trench;

step 3, forming the floating gate, including the following sub-steps:

step 31, forming a first oxide layer on side and bottom surfaces of the first gate trench;

step 32, forming a second nitrogen oxide layer on the surface of the first oxide layer;

step 33, forming a TiN layer of the floating gate on the surface of the second nitrogen oxide layer;

step 34, sequentially forming a third nitrogen oxide layer and a fourth oxide layer on the surface of the TiN layer; and step 35, fully etching the fourth oxide layer, the third nitrogen oxide layer, the TiN layer, the second nitrogen oxide layer, and the first oxide layer, so that the fourth oxide layer, the third nitrogen oxide layer, the TiN layer, the second nitrogen oxide layer, and the first oxide layer are retained only on a side surface of the first gate trench and form a spacer structure, wherein the fourth oxide layer, the third nitrogen oxide layer, the TiN layer, the second nitrogen oxide layer, and the first oxide layer on the bottom surface of the first gate trench outside the spacer structure and outside the first gate trench are removed; the retained TiN layer forms the floating gate;

the second nitrogen oxide layer forms a barrier layer for the diffusion of oxygen in the first oxide layer to the floating gate, the third nitrogen oxide layer forms a barrier layer for the diffusion of oxygen in the fourth oxide layer to the floating gate, reducing the amount of oxygen entering the floating gate and ensuring that the TiN layer of the floating gate from the bottom to the top of the floating gate is kept in a continuous structure; and the oxygen entering the floating gate makes the TiN layer of the floating gate present a nanocrystalline structure, thus increasing the ability of the floating gate to capture stored charges; and step 4, filling the first gate trench to form the control gate, wherein the top of the floating gate is higher than the top surface of the control gate.

In some cases, the method further includes steps of forming a word line gate and an erasing gate.

Two word line gates are symmetrically arranged on the semiconductor substrate on both sides of the first gate trench, and a first gate dielectric layer is provided to isolate the word line gate from the semiconductor substrate.

A second dielectric layer is provided to isolate a side surface of the first gate trench from a second side surface of the word line gate, and a first inter-gate dielectric layer is formed by stacking the second dielectric layer, the first oxide layer, and the second nitrogen oxide layer.

The erasing gate is formed at the top of the first gate trench, and the coverage of the erasing gate is greater than a region for forming the first gate trench; and a second inter-gate dielectric layer is provided to isolate the erasing gate from the first inter-gate dielectric layer, the floating gate, the third nitrogen oxide layer, and the fourth oxide layer at the bottom thereof.

A drain region is formed in the surface region of the semiconductor substrate on a first side surface of the word line gate in a self-aligned manner.

In some cases, in step 31, the first oxide layer is formed by means of an HTO oxidation process.

In some cases, wherein in step 32, the second nitrogen oxide layer is formed by nitriding the surface of the first oxide layer.

In some cases, in step 32, a process of nitriding the surface of the first oxide layer is a SPA process.

In some cases, in step 34, the fourth oxide layer is formed by means of an HTO oxidation process.

In some cases, in step 34, the third nitrogen oxide layer is formed by means of a SPA process.

In some cases, wherein in step 34, NO annealing is performed on the surface of the TiN layer before the SPA process of the third nitrogen oxide layer.

Different from an O—TiN—O structure of the existing super flash where both sides of the TiN layer of the floating gate are provided with oxide layers, the present application discloses an O—N—TiN—N—O structure where nitrogen oxide layers are respectively inserted between the TiN layer and the oxide layers on both sides thereof. The nitrogen oxide layer on both sides of the TiN layer can respectively prevent the diffusion of O on both sides into the TiN layer, so as to prevent excessive O from oxidizing the TiN layer and thus making the TiN layer present a broken discontinuous structure. Therefore, the present application can keep the structure of the TiN layer of the floating gate continuous. During erasing of the device, the stored charges at various positions need to be moved upward to the top of the floating gate and led out, so as to achieve the erasing. As the TiN layer is a continuous structure, the present application can ensure that the stored charges at the bottom all can be erased, thus improving the erasing performance of the device.

The present application can still ensure that a small amount of oxygen diffuses into the TiN layer. When the small amount of oxygen diffuses into the TiN layer, the TiN layer of the floating gate may present a nanocrystalline structure, such the non-uniform nanocrystalline structure can increase the ability of the floating gate to capture the stored charges. Therefore, the present application can also improve the writing performance of the device and increase the data retention ability of the device.

In addition, the nitrogen oxide layers inserted on both sides of the TiN layer in the present application can be achieved by the corresponding nitriding process. Therefore, the present application is simple in processes and has no adverse impact on the other structures of the device.

BRIEF DESCRIPTION OF THE DRAWINGS

The present application is further described in detail below with reference to the drawings and specific embodiments.

DETAILED DESCRIPTION OF THE DISCLOSURE

Figure 1:
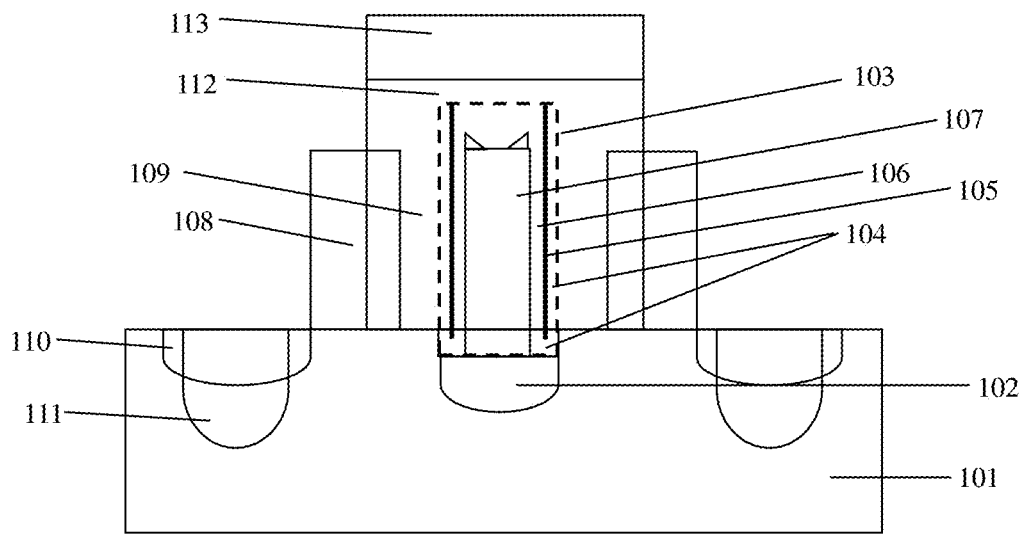
FIG. 1 is a schematic diagram of a structure of an existing 38 super flash.
Figure 2A:
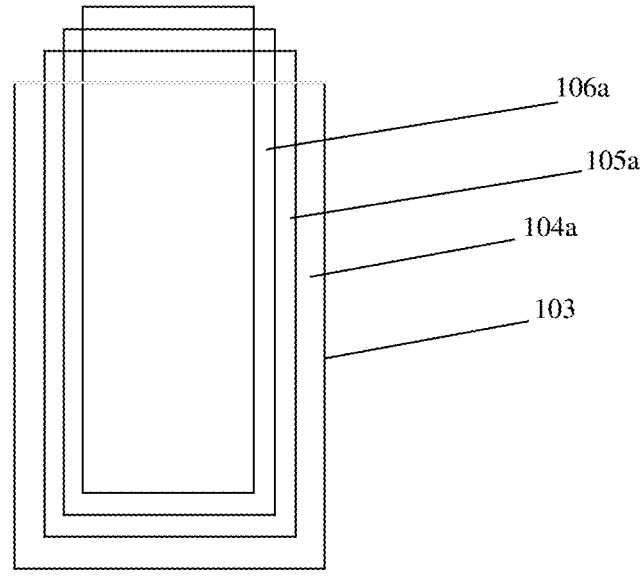
FIGS. 2A-2B are schematic diagrams of device structures in sub-steps of forming a floating gate in the existing method for manufacturing a super flash.
Figure 2B:
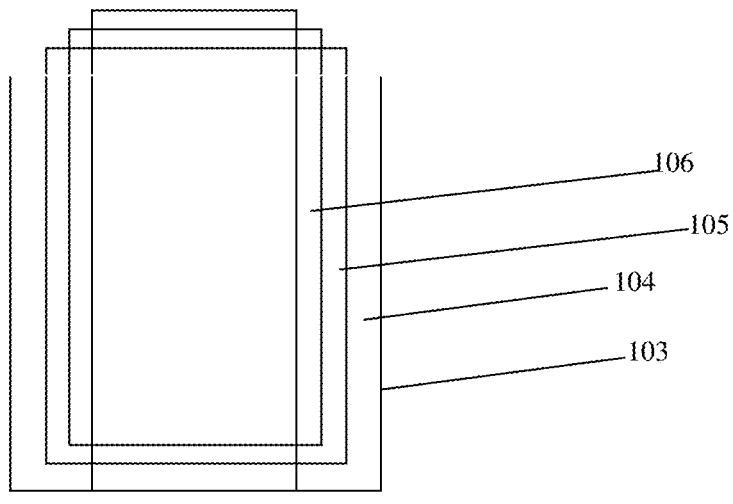
Figure 3:
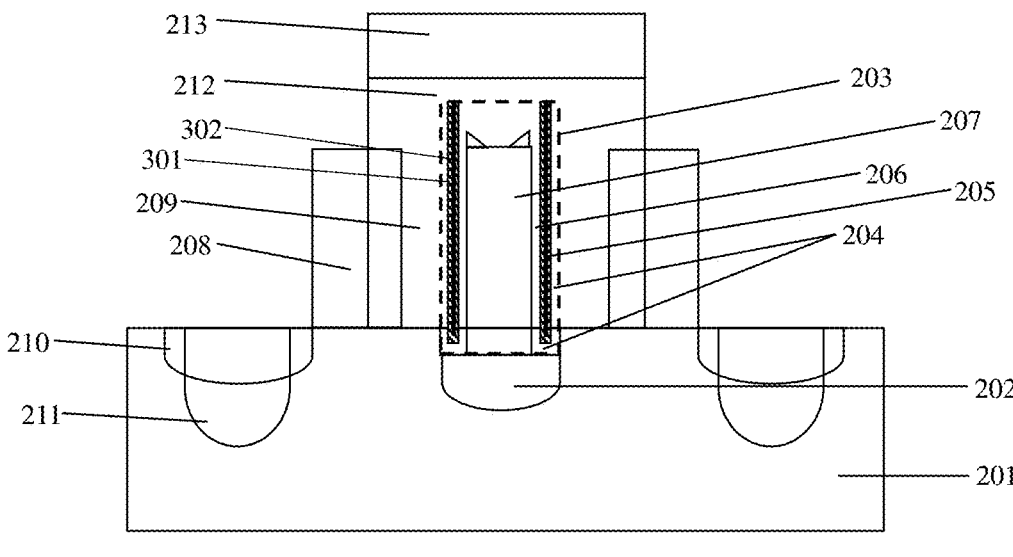
FIG. 3 is a schematic diagram of a structure of a super flash according to an embodiment of the present application.

FIG. 3 is a schematic diagram of a structure of a super flash according to an embodiment of the present application. FIGS. 4A-4F are schematic diagrams of device structures in sub-steps of forming a floating gate in a method for manufacturing a super flash according to an embodiment of the present application. The super flash according to this embodiment of the present application includes:

a first gate trench 203 formed at the top of a source region 202, wherein a bottom surface of the first gate trench 203 is lower than a top surface of a semiconductor substrate 201, and a top surface of the first gate trench 203 is higher than the top surface of the semiconductor substrate 201.

In this embodiment of the present application, the semiconductor substrate 201 includes a silicon substrate.

The source region 202 is formed in a surface region of the semiconductor substrate 201 at the bottom of the first gate trench 203.

In this embodiment of the present application, in the corresponding paper direction perpendicular to the section in FIG. 3, the source regions 202 of cells of different super flashes are connected together to form a source region line.

A floating gate 205 and a control gate 207 are formed in the first gate trench 203.

In this embodiment of the present application, the control gate 207 is a polysilicon gate or a metal gate such as tungsten. The control gate 207 is in direct contact with the source region 202 at the bottom thereof.

A second nitrogen oxide layer 301 and a first oxide layer 204 are formed between a first side surface of the floating gate 205 and side and bottom surfaces of the first gate trench 203.

In this embodiment of the present application, the first oxide layer 204 is an HTO oxide layer.

The second nitrogen oxide layer 301 is a nitride layer formed by nitriding the surface of the first oxide layer 204. In some examples, a process of nitriding the surface of the first oxide layer 204 is a SPA process.

A third nitrogen oxide layer 302 and a fourth oxide layer 206 are formed between a second side surface of the floating gate 205 and a side surface of the control gate 207.

In this embodiment of the present application, the fourth oxide layer 206 is an HTO oxide layer. In some examples, the third nitrogen oxide layer 302 is formed by means of a SPA process. NO annealing is performed on the surface of the TiN layer before the SPA process of the third nitrogen oxide layer 302.

The floating gate 205 is a TiN layer; and the top of the floating gate 205 is higher than a top surface of the control gate 207.

The second nitrogen oxide layer 301 forms a barrier layer for the diffusion of oxygen in the first oxide layer 204 to the floating gate 205, the third nitrogen oxide layer 302 forms a barrier layer for the diffusion of oxygen in the fourth oxide layer 206 to the floating gate 205, reducing the amount of oxygen entering the floating gate 205 and ensuring that the TiN layer of the floating gate 205 from the bottom to the top of the floating gate 205 is kept in a continuous structure, so that during erasing, stored charges can move from the bottom to the top of the floating gate 205 and be led out; and the oxygen entering the floating gate 205 makes the TiN layer of the floating gate 205 present a nanocrystalline structure, thus increasing the ability of the floating gate 205 to capture the stored charges.

In this embodiment of the present application, two word line gates 208 are symmetrically arranged on the semiconductor substrate 201 on both sides of the first gate trench 203, and a first gate dielectric layer (not shown) is provided to isolate the word line gate 208 from the semiconductor substrate 201.

A second dielectric layer 209 is provided to isolate a side surface of the first gate trench 203 from a second side surface of the word line gate 208, and a first inter-gate dielectric layer is formed by stacking the second dielectric layer 209, the first oxide layer 204, and the second nitrogen oxide layer 301.

An erasing gate 213 is formed at the top of the first gate trench 203, and the coverage of the erasing gate 213 is greater than a region for forming the first gate trench 203; and a second inter-gate dielectric layer 212 is provided to isolate the erasing gate 213 from the first inter-gate dielectric layer, the floating gate 205, the third nitrogen oxide layer 302, and the fourth oxide layer 206 at the bottom thereof.

In some embodiments, the second dielectric layer 209 and the second inter-gate dielectric layer 212 are both oxide layers, so images corresponding to the second dielectric layer 209, the second inter-gate dielectric layer 212, the first oxide layer 204, and the fourth oxide layer 206 in FIG. 3 are all filled with the same points.

A drain region 211 is formed in the surface region of the semiconductor substrate 201 on a first side surface of the word line gate 208 in a self-aligned manner. Generally, a spacer is also formed on the first side surface of the word line gate 208, and the drain region 211 is self-aligned with the spacer on the first side surface of the word line gate 208. A lightly doped drain (LDD) region 210 is also formed on one side of the drain region 211, and the lightly doped drain region 210 is self-aligned with the first side surface of the word line gate 208.

In some embodiments, the word line gate 208 is a polysilicon gate or a metal gate; and the erasing gate 213 is a polysilicon gate or a metal gate.

Different from an O—TiN—O structure of the existing super flash where both sides of the TiN layer of the floating gate 205 are provided with oxide layers, this embodiment of the present application discloses an O—N—TiN—N—O structure where nitrogen oxide layers are respectively inserted between the TiN layer and the oxide layers on both sides thereof. The nitrogen oxide layer on both sides of the TiN layer can respectively prevent the diffusion of O on both sides into the TiN layer, so as to prevent excessive O from oxidizing the TiN layer and thus making the TiN layer present a broken discontinuous structure. Therefore, the present application can keep the structure of the TiN layer of the floating gate continuous. During erasing of the device, the stored charges at various positions need to be moved upward to the top of the floating gate 205 and led out, so as to achieve the erasing. As the TiN layer is a continuous structure, this embodiment of the present application can ensure that the stored charges at the bottom all can be erased, thus improving the erasing performance of the device.

The embodiment of the present application can still ensure that a small amount of oxygen diffuses into the TiN layer. When the small amount of oxygen diffuses into the TiN layer, the TiN layer of the floating gate 205 may present a nanocrystalline structure, Such the non-uniform nanocrystalline structure can increase the ability of the floating gate 205 to capture the stored charges. Therefore, this embodiment of the present application can also improve the writing performance of the device and increase the data retention ability of the device.

In addition, the nitrogen oxide layers inserted on both sides of the TiN layer in this embodiment of the present application can be achieved by the corresponding nitriding process. Therefore, this embodiment of the present application is simple in processes and has no adverse impact on the other structures of the device.

FIGS. 4A-4F are schematic diagrams of device structures in sub-steps of forming a floating gate in a method for manufacturing a super flash according to an embodiment of the present application. The method for manufacturing a super flash according to this embodiment of the present application includes the following steps:

Step 1. Referring to FIG. 3, a first gate trench 203 is formed in a region for forming a floating gate 205 and a control gate 207, wherein the first gate trench 203 is located at the top of a region for forming a source region 202, a bottom surface of the first gate trench 203 is lower than a top surface of a semiconductor substrate 201, and a top surface of the first gate trench 203 is higher than the top surface of the semiconductor substrate 201.

Step 2. The source region 202 is formed in a surface region of the semiconductor substrate 201 at the bottom of the first gate trench 203.

Step 3. The floating gate 205 is formed, including the following sub-steps.

Figure 4A:
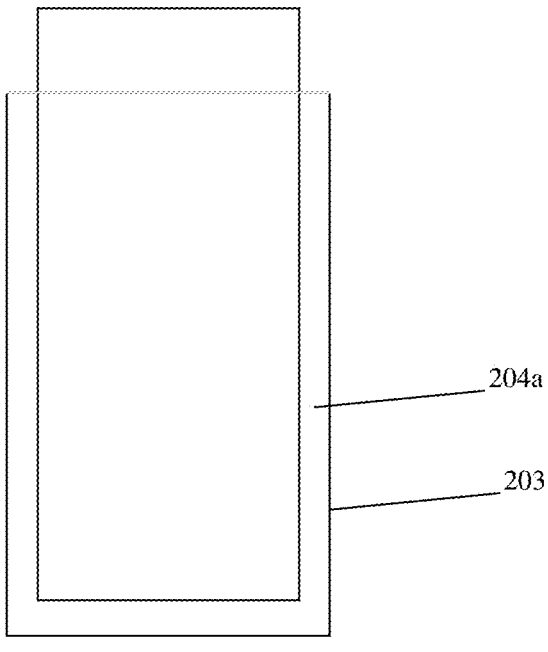
FIGS. 4A-4F are schematic diagrams of device structures in sub-steps of forming a floating gate in a method for manufacturing a super flash according to an embodiment of the present application.

Step 31. Referring to FIG. 4A, a first oxide layer 204*a* is formed on side and bottom surfaces of the first gate trench 203.

In the method of this embodiment of the present application, the first oxide layer 204*a* is formed by means of an HTO oxidation process.

Figure 4B:
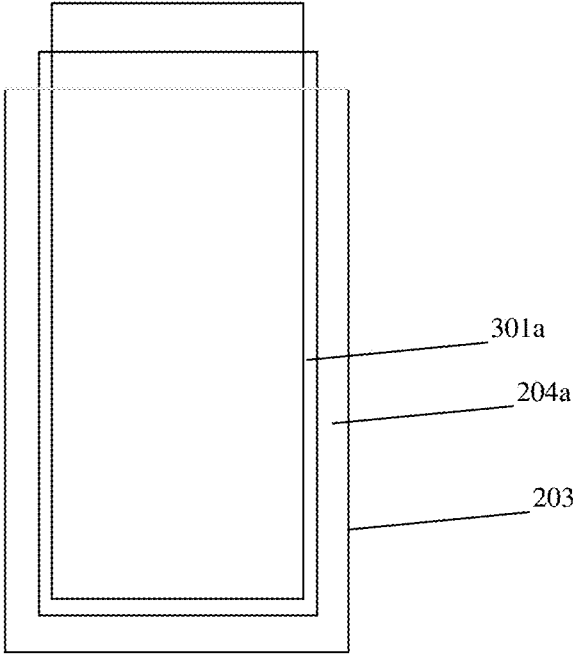

Step 32. Referring to FIG. 4B, a second nitrogen oxide layer 301*a* is formed on the surface of the first oxide layer 204*a*.

In the method of this embodiment of the present application, the second nitrogen oxide layer 301 is formed by nitriding the surface of the first oxide layer 204.

In some examples, a process of nitriding the surface of the first oxide layer 204 is a SPA process.

Figures 4C, 4D:
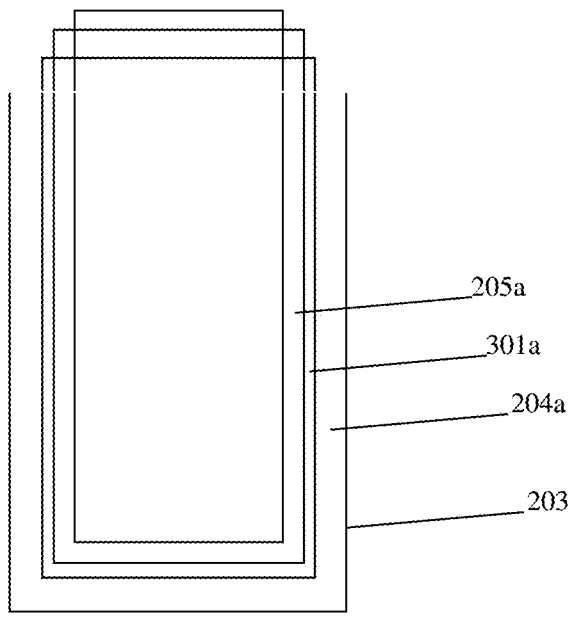

Step 33. Referring to FIG. 4C, a TiN layer 205*a* of the floating gate 205 is formed on the surface of the second nitrogen oxide layer 301.

Figures 4E, 4F:
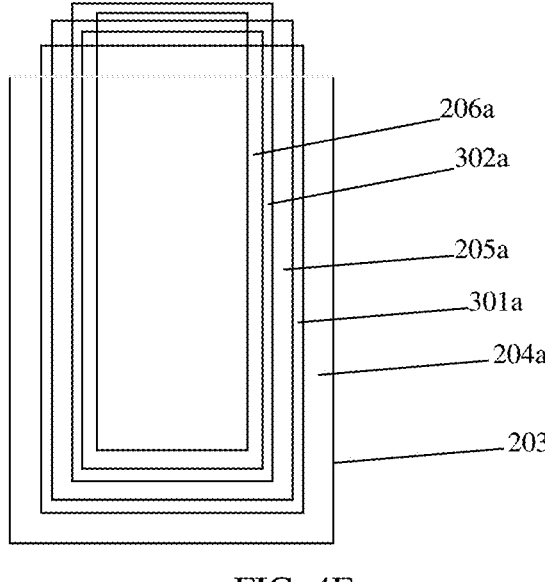

Step 34. Referring to FIG. 4E, a third nitrogen oxide layer 302*a* and a fourth oxide layer 206*a* are sequentially formed on the surface of the TiN layer 205*a*.

In the method of this embodiment of the present application, the fourth oxide layer 206*a* is formed by means of an HTO oxidation process.

The third nitrogen oxide layer 302*a* is formed by means of a SPA process.

Referring to FIG. 4D, NO annealing is performed on the surface of the TiN layer 205*a* before the SPA process of the third nitrogen oxide layer 302*a*. The NO annealing is as shown by arrow line 303.

Step 35. Referring to FIG. 4F, the fourth oxide layer 206*a*, the third nitrogen oxide layer 302*a*, the TiN layer 205*a*, the second nitrogen oxide layer 301*a*, and the first oxide layer 204*a* are fully etched, so that the fourth oxide layer 206, the third nitrogen oxide layer 302, the TiN layer, the second nitrogen oxide layer 301, and the first oxide layer 204 are retained only on a side surface of the first gate trench 203 and form a spacer structure. The fourth oxide layer 206, the third nitrogen oxide layer 302, the TiN layer, the second nitrogen oxide layer 301, and the first oxide layer 204 on the bottom surface of the first gate trench 203 outside the spacer structure and outside the first gate trench 203 are removed. The retained TiN layer forms the floating gate 205. In FIG. 4E, the non-etched fourth oxide layer, third nitrogen oxide layer, TiN layer, second nitrogen oxide layer, and first oxide layer are represented by marks 206*a*, 302*a*, 205*a*, 301*a*, and 204*a* respectively. In FIG. 4F, the non-etched fourth oxide layer, third nitrogen oxide layer, TiN layer, second nitrogen oxide layer, and first oxide layer are represented by marks 206, 302, 205, 301, and 204 respectively.

The second nitrogen oxide layer 301 forms a barrier layer for the diffusion of oxygen in the first oxide layer 204 to the floating gate 205, the third nitrogen oxide layer 302 forms a barrier layer for the diffusion of oxygen in the fourth oxide layer 206 to the floating gate 205, reducing the amount of oxygen entering the floating gate 205 and ensuring that the TiN layer of the floating gate 205 from the bottom to the top of the floating gate 205 is kept in a continuous structure. The oxygen entering the floating gate 205 makes the TiN layer of the floating gate 205 present a nanocrystalline structure, thus increasing the ability of the floating gate 205 to capture stored charges.

Step 4. Referring to FIG. 3, the first gate trench 203 is filled to form the control gate 207, wherein the top of the floating gate 205 is higher than the top surface of the control gate 207.

The method of this embodiment of the present application further includes steps of forming a word line gate 208 and an erasing gate 213.

Referring to FIG. 3, two word line gates 208 are symmetrically arranged on the semiconductor substrate 201 on both sides of the first gate trench 203, and a first gate dielectric layer is provided to isolate the word line gate 208 from the semiconductor substrate 201.

A second dielectric layer 209 is provided to isolate a side surface of the first gate trench 203 from a second side surface of the word line gate 208, and a first inter-gate dielectric layer is formed by stacking the second dielectric layer 209, the first oxide layer 204, and the second nitrogen oxide layer 301.

The erasing gate 213 is formed at the top of the first gate trench 203, and the coverage of the erasing gate 213 is greater than a region for forming the first gate trench 203. A a second inter-gate dielectric layer 212 is provided to isolate the erasing gate 213 from the first inter-gate dielectric layer, the floating gate 205, the third nitrogen oxide layer 302, and the fourth oxide layer 206 at the bottom thereof.

A drain region 211 is formed in the surface region of the semiconductor substrate 201 on a first side surface of the word line gate 208 in a self-aligned manner. Generally, before formation of the drain region 211, a step of forming a lightly doped drain region 210 is performed. The lightly doped drain region 210 is self-aligned with the first side surface of the word line gate 208. A spacer is formed on the first side surface of the word line gate 208, and then the drain region 211 is formed. In this case, the drain region 211 is self-aligned with the spacer on the first side surface of the word line gate 208.

Figure 5A:
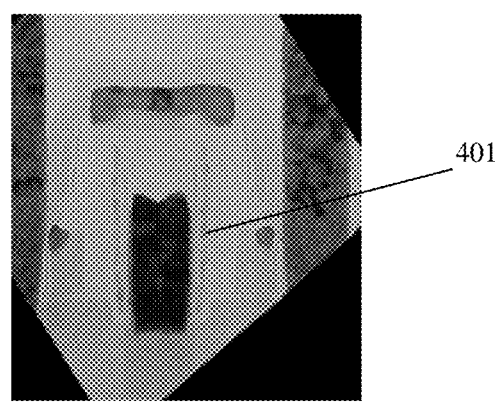
FIG. 5A is a picture of forming a TiN layer of the floating gate in the existing method for manufacturing a super flash.
Figure 5B:
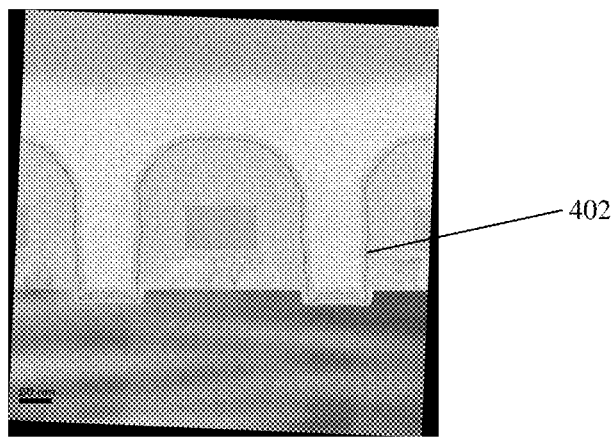
FIG. 5B is a picture of forming a TiN layer of the floating gate in the method for manufacturing a super flash according to an embodiment of the present application.
Figure 5C:
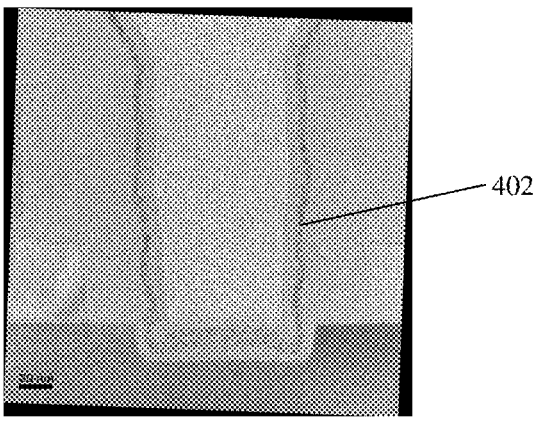
FIG. 5C is an enlarged picture of FIG. 5B.

As can be seen from FIG. 4E, the fourth oxide layer 206*a*, the third nitrogen oxide layer 302*a*, the TiN layer 205*a*, the second nitrogen oxide layer 301*a*, and the first oxide layer 204 present a structure of an O—N—TiN—N—O layer, wherein N represents a nitrogen oxide layer. The third nitrogen oxide layer 302*a* and the second nitrogen oxide layer 301*a* prevent oxygen on both sides from entering the TiN layer 205*a*, thus preventing the TiN layer 205*a* from being broken due to excessive oxidation. FIG. 5B is a picture of forming the TiN layer of the floating gate in the method for manufacturing a super flash according to this embodiment of the present application. FIG. 5C is an enlarged picture of FIG. 5B. It can be seen that mark 402 corresponds to the picture of the TiN layer 205*a*. It can be seen that a line corresponding to mark 402 is not broken, indicating that the TiN layer 205*a* presents a continuous structure.

The present application is described in detail above via specific embodiments, which, however, do not intend to limit the present application. Without departing from the principle of the present application, those skilled in the art could also make many changes and improvements, which should also be construed as the protection scope of the present application.

What is claimed is:

1. A method for manufacturing a super flash, comprising the following steps:

step 1, forming a first gate trench in a region for forming a floating gate and a control gate, wherein the first gate trench is located at the top of a region for forming a source region, a bottom surface of the first gate trench is lower than a top surface of a semiconductor substrate, and a top surface of the first gate trench is higher than the top surface of the semiconductor substrate;

step 2, forming the source region in a surface region of the semiconductor substrate at the bottom of the first gate trench;

step 3, forming the floating gate, comprising the following sub-steps:

step 31, forming a first oxide layer on side and bottom surfaces of the first gate trench; step 32, forming a second nitrogen oxide layer on the surface of the first oxide layer;

step 33, forming a TiN layer of the floating gate on the surface of the second nitrogen oxide layer;

step 34, sequentially forming a third nitrogen oxide layer and a fourth oxide layer on the surface of the TiN layer; and step 35, fully etching the fourth oxide layer, the third nitrogen oxide layer, the TiN layer, the second nitrogen oxide layer, and the first oxide layer, so that the fourth oxide layer, the third nitrogen oxide layer, the TiN layer, the second nitrogen oxide layer, and the first oxide layer are retained only on a side surface of the first gate trench and form a spacer structure, wherein the fourth oxide layer, the third nitrogen oxide layer, the TiN layer, the second nitrogen oxide layer, and the first oxide layer on the bottom surface of the first gate trench outside the spacer structure and outside the first gate trench are removed; the retained TiN layer forms the floating gate;

the second nitrogen oxide layer forms a barrier layer for the diffusion of oxygen in the first oxide layer to the floating gate, the third nitrogen oxide layer forms a barrier layer for the diffusion of oxygen in the fourth oxide layer to the floating gate, reducing the amount of oxygen entering the floating gate and ensuring that the TiN layer of the floating gate from the bottom to the top of the floating gate is kept in a continuous structure; and the oxygen entering the floating gate makes the TiN layer of the floating gate present a nanocrystalline structure, thus increasing the ability of the floating gate to capture stored charges; and step 4, filling the first gate trench to form the control gate, wherein the top of the floating gate is higher than the top surface of the control gate.

2. The method for manufacturing a super flash according to claim 1, further comprising steps of forming a word line gate and an erasing gate; wherein two word line gates are symmetrically arranged on the semiconductor substrate on both sides of the first gate trench, and a first gate dielectric layer is provided to isolate the word line gate from the semiconductor substrate;

a second dielectric layer is provided to isolate a side surface of the first gate trench from a second side surface of the word line gate, and a first inter-gate dielectric layer is formed by stacking the second dielectric layer, the first oxide layer, and the second nitrogen oxide layer;

the erasing gate is formed at the top of the first gate trench, and the coverage of the erasing gate is greater than a region for forming the first gate trench; a second inter-gate dielectric layer is provided to isolate the erasing gate from the first inter-gate dielectric layer, the floating gate, the third nitrogen oxide layer, and the fourth oxide layer at the bottom thereof; and a drain region is formed in the surface region of the semiconductor substrate on a first side surface of the word line gate in a self-aligned manner.

3. The method for manufacturing a super flash according to claim 1, wherein in step 31, the first oxide layer is formed by means of an HTO oxidation process.

4. The method for manufacturing a super flash according to claim 3, wherein in step 32, the second nitrogen oxide layer is formed by nitriding the surface of the first oxide layer.

5. The method for manufacturing a super flash according to claim 4, wherein in step 32, a process of nitriding the surface of the first oxide layer is a SPA process.

6. The method for manufacturing a super flash according to claim 1, wherein in step 34, the fourth oxide layer is formed by means of an HTO oxidation process.

7. The method for manufacturing a super flash according to claim 6, wherein in step 34, the third nitrogen oxide layer is formed by means of a SPA process.

8. The method for manufacturing a super flash according to claim 7, wherein in step 34, NO annealing is performed on the surface of the TiN layer before the SPA process of the third nitrogen oxide layer.

* * * * *